United States Patent
Hauck

(10) Patent No.: US 8,512,669 B2
(45) Date of Patent: Aug. 20, 2013

(54) GRAPHENE PRODUCTION USING LASER HEATED CRYSTAL GROWTH

(75) Inventor: James Pierre Hauck, San Diego, CA (US)

(73) Assignee: Empire Technology Development LLC, Wilmington, DE (US)

( * ) Notice: Subject to any disclaimer, the term of this patent is extended or adjusted under 35 U.S.C. 154(b) by 63 days.

(21) Appl. No.: 13/129,557

(22) PCT Filed: Nov. 29, 2010

(86) PCT No.: PCT/US2010/058225
§ 371 (c)(1),
(2), (4) Date: May 16, 2011

(87) PCT Pub. No.: WO2012/074506
PCT Pub. Date: Jun. 7, 2012

(65) Prior Publication Data
US 2012/0132353 A1    May 31, 2012

(51) Int. Cl.
*C01B 31/04* (2006.01)

(52) U.S. Cl.
USPC ............. 423/448; 423/445 R; 423/445 B; 428/220; 977/734

(58) Field of Classification Search
USPC .................................... 423/445 R; 977/734
See application file for complete search history.

(56) References Cited

U.S. PATENT DOCUMENTS

| | | | |
|---|---|---|---|
| 3,650,703 A * | 3/1972 | Labelle et al. | 117/25 |
| 6,139,919 A | 10/2000 | Eklund et al. | |
| 6,683,783 B1 | 1/2004 | Liu et al. | |
| 6,749,827 B2 | 6/2004 | Smalley et al. | |
| 6,756,025 B2 * | 6/2004 | Colbert et al. | 423/447.3 |
| 6,756,026 B2 | 6/2004 | Colbert et al. | |
| 6,824,755 B2 | 11/2004 | Colbert et al. | |
| 6,936,233 B2 | 8/2005 | Smalley et al. | |
| 6,939,525 B2 | 9/2005 | Colbert et al. | |
| 6,949,237 B2 | 9/2005 | Smalley et al. | |
| 6,979,709 B2 | 12/2005 | Smalley et al. | |
| 6,986,876 B2 | 1/2006 | Smalley et al. | |
| 7,008,604 B2 | 3/2006 | Smalley et al. | |
| 7,041,620 B2 | 5/2006 | Smalley et al. | |
| 7,048,903 B2 | 5/2006 | Colbert et al. | |
| 7,048,999 B2 | 5/2006 | Smalley et al. | |
| 7,052,666 B2 | 5/2006 | Colbert et al. | |

(Continued)

FOREIGN PATENT DOCUMENTS
WO    2006060476 A2    6/2006

OTHER PUBLICATIONS

Camara, N., et al. "Anisotropic growth of long isolated graphene ribbons on the C face of graphite-capped 6H-SiC" Physical Review B 80, 125410 (2009).*

(Continued)

*Primary Examiner* — Daniel C McCracken
*Assistant Examiner* — Richard M Rump
(74) *Attorney, Agent, or Firm* — Turk IP Law LLC

(57) ABSTRACT

Implementations and techniques for producing graphene are generally disclosed. A seed crystal may be affixed to a support substrate such that the seed crystal faces substantially downwardly and such that the formed graphene crystal hangs substantially downwardly. Feedstock may be provided adjacent to the seed crystal, and a laser beam may be applied to heat the seed crystal and the feedstock to grow a graphene crystal.

20 Claims, 6 Drawing Sheets

(56) References Cited

U.S. PATENT DOCUMENTS

| | | |
|---|---|---|
| 7,067,098 B2 | 6/2006 | Colbert et al. |
| 7,071,406 B2 | 7/2006 | Smalley et al. |
| 7,087,207 B2 | 8/2006 | Smalley et al. |
| 7,097,820 B2 | 8/2006 | Colbert et al. |
| 7,105,596 B2 | 9/2006 | Smalley et al. |
| 7,108,841 B2 | 9/2006 | Smalley et al. |
| 7,115,864 B2 | 10/2006 | Colbert et al. |
| 7,205,069 B2 | 4/2007 | Smalley et al. |
| 7,354,563 B2 | 4/2008 | Smalley et al. |
| 7,357,906 B2 | 4/2008 | Colbert et al. |
| 7,390,477 B2 | 6/2008 | Smalley et al. |
| 7,390,767 B2 | 6/2008 | Smalley et al. |
| 7,419,624 B1 | 9/2008 | Smalley et al. |
| 7,419,651 B2 | 9/2008 | Smalley et al. |
| 7,481,989 B2 | 1/2009 | Smalley et al. |
| 7,510,695 B2 | 3/2009 | Smalley et al. |
| 7,632,569 B2 | 12/2009 | Smalley et al. |
| 7,655,302 B2 | 2/2010 | Smalley et al. |
| 7,790,243 B2 | 9/2010 | Radhakrishnan et al. |
| 7,939,136 B2 | 5/2011 | Smalley et al. |
| 7,959,779 B2 | 6/2011 | Colbert et al. |
| 2009/0136412 A1* | 5/2009 | Awano et al. .............. 423/447.1 |
| 2010/0003462 A1 | 1/2010 | Kamins et al. |
| 2010/0247801 A1 | 9/2010 | Zenasni |

OTHER PUBLICATIONS

Australia Patent Office, International Search Report and Written Opinion of the International Searching Authority, Mar. 21, 2011, pp. 1-12, Australia.

Wikipedia, Laser-heated pedestal growth, Wikipedia, the free encyclopedia, last modified on Apr. 28, 2011, accessed online on May 11, 2011 via http://en.wikipedia.org/wiki/Laser-heated_pedestal_growth.

Fejer, M., et al., Advances in infrared fibers II, A Reprint from the Proceedings of SPIE—The International Society for Optical Engineering (Los Angeles, CA), Jan. 26-28, 1982, pp. 50-55, vol. 320, The Society of Photo-Optical Instrumentation Engineers, Bellingham, Washington, USA.

Singhal, V.P., et al., Studies of graphite surface after laser irradiation, Bulletin of Material Science, Aug. 1997, pp. 719-725, vol. 20, No. 5, Indian Academy of Sciences, Bangalore, India.

Sokolowski, M., et al., Allotropic phase transformations induced by ultraviolet power laser irradiation of graphite, Journal of Materials Science, Jan. 1990, pp. 379-383, vol. 25, No. 1, Chapman and Hall Ltd., London, England.

Speck, J.S., Microstructural studies of laser irradiated graphite surfaces, Journal of Materials Research, May 1990, pp. 980-988, vol. 5, No. 5, Cambridge University Press.

Edmonds, W.R., The reflaxicon, a new reflective optical element, and some applications, Applied Optics, Aug. 1973, pp. 1940-1945, vol. 12, No. 8, Optical Society of America.

* cited by examiner

500 A computer program product

502 A signal bearing medium 504 at least one of one or more instructions for formatting data to instruct a process unit to affix a seed crystal to a support substrate;

one or more instructions for formatting data to instruct the process unit to provide a feedstock substantially adjacent to the seed crystal;

one or more instructions for formatting data to instruct the process unit to apply a laser beam to heat at least a portion of the seed crystal and at least a portion of the feedstock, wherein a graphene crystal is formed;

one or more instructions for formatting data to instruct the process unit to apply an electrostatic field, wherein the electrostatic field is effective to apply a straightening force to the graphene crystal; or one or more instructions for formatting data to instruct the process unit to remove the graphene crystal.

| 506 a computer-readable medium | 508 a recordable medium | 510 a communications medium |

Fig. 5

GRAPHENE PRODUCTION USING LASER HEATED CRYSTAL GROWTH

BACKGROUND

Unless otherwise indicated herein, the approaches described in this section are not prior art to the claims in this application and are not admitted to be prior art by inclusion in this section.

Graphene may include a sheet or sheets of bonded carbon atoms. Graphene may exhibit many useful properties related to its electrical conductivity, thermal conductivity and mechanical strength. Producing large crystals of graphene may be time consuming and difficult.

SUMMARY

In accordance with some implementations, methods for producing graphene may include affixing a seed crystal to a support substrate such that the seed crystal faces substantially downwardly from the support substrate about a location, providing a feedstock substantially adjacent to the seed crystal about the location, and applying a laser beam to heat a portion of the seed crystal and a portion of the feedstock about the location to form a graphene crystal that hangs substantially downwardly from the surface of the support structure.

In accordance with some implementations, apparatuses for producing graphene may include a seed crystal affixed to a support substrate such that the seed crystal faces substantially downwardly from the support substrate about a location, a feedstock injector configured to provide a feedstock substantially adjacent to the seed crystal about the location, a laser configured to generate a laser beam, and beam shaping optics configured to couple the laser beam to a portion of the seed crystal and a portion of the feedstock about the location to form a downwardly hanging graphene crystal.

In accordance with some implementations, an article may include a computer program product having stored therein instructions that, when executed by a processing unit, configure the processing unit to provide a feedstock substantially adjacent to a seed crystal that is affixed to a support substrate such that the seed crystal faces substantially downwardly from the support substrate and to provide a laser beam to heat a portion of the seed crystal and a portion of the feedstock to form a graphene crystal that hangs substantially downwardly from the surface of the support structure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the drawings:

FIG. 5 is an illustration of an example computer program product; and

DETAILED DESCRIPTION

Figure 1:
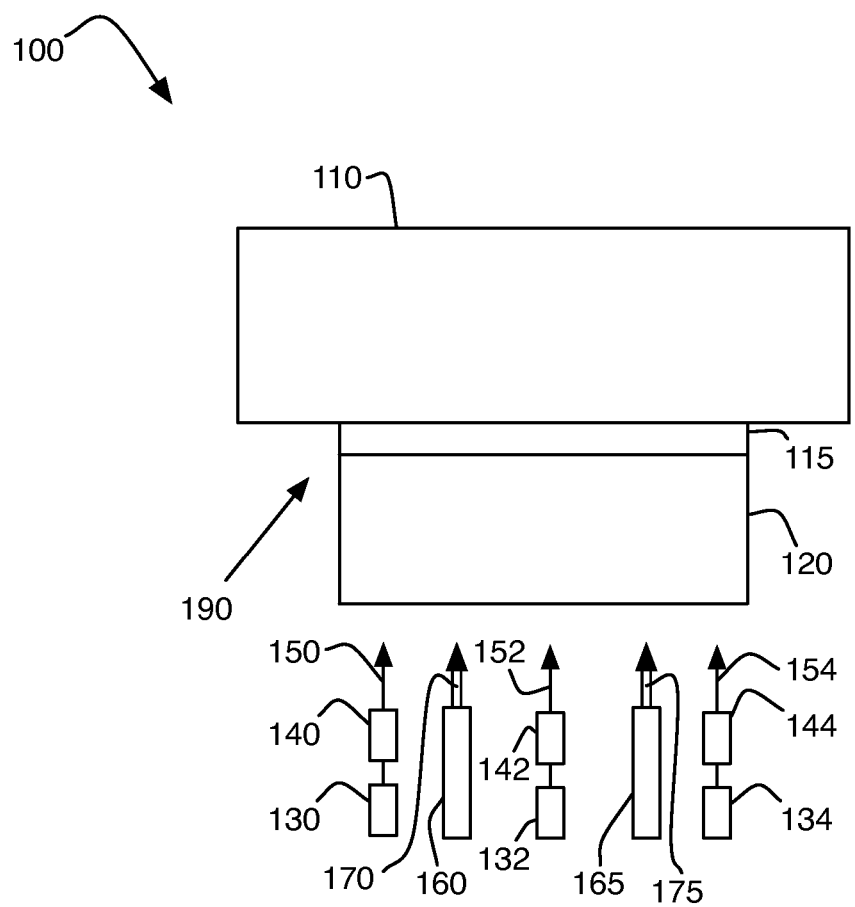
FIG. 1 is an illustration of an example apparatus for producing graphene.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is generally drawn, inter alia, to methods, apparatuses, systems and computer readable media related to producing graphene.

It may be desirable to rapidly produce substantially pure graphene crystals. The graphene may be in the shape of a sheet, sheets, ribbons or circuit patterns of bonded carbon atoms, for example. In some examples, graphene crystals may be produced by affixing a seed crystal to a support substrate, providing feedstock adjacent to the seed crystal, and applying a laser beam to heat the seed crystal and the feedstock to grow a graphene crystal. In general, the laser beam may be adapted to heat portions of the seed crystal and feedstock to facilitate crystal growth. In some examples, the seed crystal may be affixed to the support substrate such that the seed crystal faces substantially downwardly and such that the formed graphene crystal hangs substantially downwardly. Configuring the crystal growth such that the graphene crystal hangs downwardly may compensate for a lack of stiffness of the graphene that may result in raveling, which may cause impure crystal growth and other processing problems. In some examples, the graphene crystal may be grown in a suspension to further compensate for the lack of stiffness of the graphene crystal. In some examples, an electrostatic field may be applied to provide a straightening force to the graphene such that raveling may not occur.

FIG. 1 is an illustration of an example apparatus 100 that may be configured to produce a graphene crystal 120, arranged in accordance with at least some embodiments described herein. Apparatus 100 may include a support substrate 110, lasers 130, 132, 134, beam shaping optics 140, 142, 144, and feedstock injectors 160, 165. A seed crystal 115 may be affixed to support substrate about a location 190 and, as is discussed further herein, graphene crystal 120 may be formed. Feedstock injectors 160, 165 may be configured to provide feedstocks 170, 175 substantially adjacent to seed crystal 115 and/or graphene crystal 120 and about location 190. Lasers 130, 132, 134 and beam shaping optics 140, 142, 144 may be configured to couple laser beams 150, 152, 154 to seed crystal 115, graphene crystal 120 and/or feedstock 170, 175.

Figure 2:
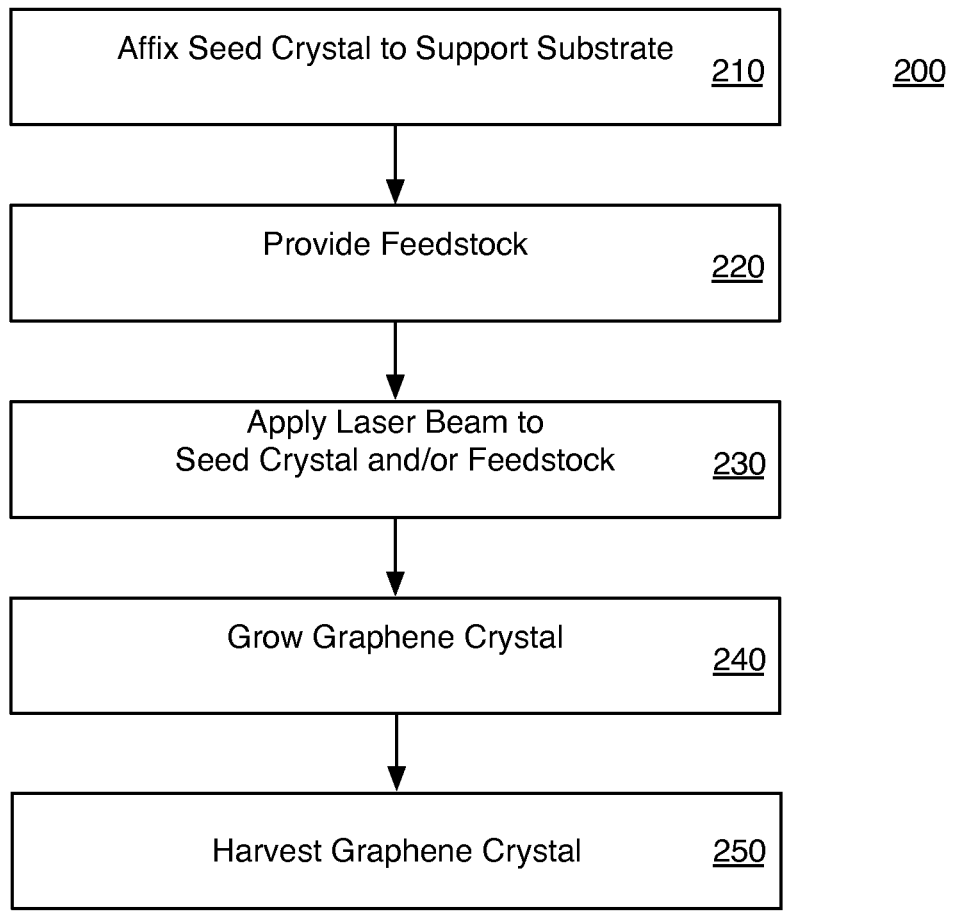
FIG. 2 is an illustration of a flow chart of an example method for producing graphene.

FIG. 2 is an illustration of a flow chart of an example method 200 for producing a graphene crystal in accordance with at least some examples described herein. Method 200 may include one or more functions, operations or actions as illustrated by one or more of blocks 210, 220, 230, 240 and/or 250. In some examples, method 200 may be implemented under the control of a computer system, as is discussed further herein. Processing for method 200 may begin at block 210.

At block 210, "Affix Seed Crystal to Support Substrate", a graphene seed crystal may be affixed to a support substrate. The support substrate may be provided or attained, for example, and, in some examples, the support substrate may be attached to or may be a part of a base or pedestal. In an example, seed crystal 115 may be secured to a surface of support substrate 110 such that seed crystal 115 faces substantially downwardly from the support substrate about location 190 (please refer to FIG. 1). Processing may continue at block 220.

At block 220, "Provide Feedstock", a feedstock may be provided. In an example, the feedstock may be provided about location 190 and substantially adjacent to seed crystal 115 using one or more feedstock injectors 150, 155 (please refer to FIG. 1). In general, the feedstock may include any material or materials that may facilitate the growth of a graphene crystal. In some examples, the feedstock may include carbon, graphite particles, other carbon containing compounds, an oxidizer or a reducer. Processing may continue at block 230.

At block 230, "Apply Laser Beam to Seed Crystal and/or Feedstock", a laser beam may be selectively applied to heat a portion or all of the feedstock and/or a portion or all of the seed crystal. The laser beam and heating may facilitate the formation of a graphene crystal. In some examples, graphene crystal 120 may be formed substantially perpendicular to a surface of support substrate 110 (please refer to FIG. 1). In some examples, the formed graphene crystal 120 may hang substantially downwardly from the surface of support substrate 110. The graphene crystal hanging substantially downwardly may facilitate prevention of the formed graphene from raveling. In some examples, graphene crystal 120 may include bonded carbon atoms in the form of a sheet, a ribbon or circuit paths, or the like. As discussed, in some examples, the laser beam may be applied after the feedstock is provided. In other examples, the laser beam may be applied before the feedstock, which may provide preheating of the seed crystal, for example. In other examples, the laser beam and the feedstock may be started substantially simultaneously. Processing may continue at block 240.

At block 240, "Grow Graphene Crystal", a graphene crystal may be grown by continuing to provide feedstock and by applying a laser beam. In some examples, the laser beam may be applied substantially continuously during processing. In some examples, pulsed lasing may be applied. As is further discussed below, in some examples, the laser may be stopped and started during processing, various laser parameters (i.e., intensity, wavelength, exposure duration, application of pulsed and/or continuous lasing) may be changed during processing. The processing may continue until the crystal is obtained, for example. During processing, a variety of parameters may be monitored, such as, for example, process temperature, process pressure, various crystal characteristics, crystal length, or the like. In some examples, the processing may continue until a predetermined crystal length is obtained. In some examples, the aforementioned process monitoring and decisions may be implemented by a process control unit, as is discussed further herein. Processing may continue at block 250.

At block 250, "Harvest Graphene Crystal", the graphene crystal may be harvested by various suitable techniques. In an example, the graphene crystal may be cut or removed from the support by force. In other examples, an epoxy used to secure the seed crystal may be dissolved or melted. In some examples, the cutting, removal by force or dissolving or melting of the epoxy may be performed by equipment, such as laser cutting tools, mechanical grippers, heaters or the like, under control of a process control unit.

As shown in FIG. 1, apparatus 100 may include a support substrate 110. Support substrate 110 may include a variety of suitable configuration and material or materials for affixation of seed crystal 115 and growth of a graphene crystal 120 such that the support substrate may not vaporize, diffuse or react with the feedstock during processing. In some examples, support substrate 100 may be silicon carbide, silicon dioxide, copper, or other refractory metals or compounds. In other examples, the support substrate material may include a base portion and a coating portion. The coating portion may be silicon carbide, silicon dioxide, copper, or other refractory metals or compounds, and may provide a surface for affixing the seed crystal.

Seed crystal 115 may be affixed to support substrate 110 using a variety of suitable techniques. In some examples, seed crystal 115 may be affixed using an epoxy, such as a high temperature epoxy. In some examples, seed crystal 115 may be affixed using a thermal attach method. In some examples, seed crystal 115 may be affixed using a eutectic attach method. In some examples, seed crystal 115 may be affixed automatically or using a robotically actuated device, which may be under the control of a process control unit, as is discussed further below. Seed crystal 115 may be affixed to various suitable surfaces of support substrate 110. As discussed, in an example, seed crystal 115 may be affixed to a bottom surface of support substrate 110 such that it faces substantially downwardly from the support substrate. In other examples, seed crystal 115 may be affixed to a side surface or a top surface of the support substrate.

Seed crystal 115 may be affixed to support substrate 110 in a wide variety of suitable orientations. In an example, seed crystal 115 may include a crystal growth axis and the seed crystal may be affixed to the support substrate such that the feedstock and laser beam are provided incident to the crystal growth axis during processing. As shown, in some examples, a single seed crystal may be used to form a single graphene crystal. In other examples, two or more seed crystals may be used to form multiple graphene crystals during processing.

Feedstock may be provided substantially adjacent to seed crystal 115 and about location 190 in various suitable manners. As graphene crystal 120 grows, the feedstock may be provided substantially adjacent to the growing seed crystal. As discussed, in an example, the feedstock may be provided using one or more feedstock injectors. In some example, a single feedstock injector may be used. In other examples, two or three or more feedstock injectors may be used. In some examples, the feedstock injector or injectors may remain stationary. In other examples, the feedstock injector or injectors may move as the processing continues. In other examples, the support substrate may move and the injectors may remain stationary. For example, the injector or injectors and support substrate may move relative to each other such that the injector or injectors move away from the support substrate as the crystal grows to facilitate providing the feedstock substantially adjacent to the growing crystal. The feedstock injector or injectors may be arranged in various suitable manners. In some examples, multiple injectors may be arranged on opposing sides of seed crystal 115 and about location 190.

In some examples, the feedstock may be provided at a sufficiently slow rate such that the graphene crystal may not be disrupted from hanging substantially downwardly during processing. In some examples, the feedstock may be provided in the laminar flow regime. In some examples, the feedstock may be provided continuously as the crystal grows. In other examples, the feedstock may be turned on and/or off as the crystal grows or the feedstock may be cycled as the crystal grows. As discussed, the feedstock may contain carbon, graphite particles, other carbon containing compounds, an oxidizer or oxidizers, and/or a reducer or reducers, or various combinations thereof. In some examples, the feedstock composition may remain substantially constant during processing. In other examples, the feedstock composition may change during processing. In an example, the selectivity and composition of feedstock may be controlled using a process control unit, as discussed further herein. Feedstock injectors 160, 165 may include various suitable devices for growing a graphene crystal. In some examples, the feedstock injector or injectors may provide a convective melt motion that may provide for graphene crystal growth. In some examples, the feedstock injectors may include a nozzle or multiple nozzles.

As shown, a laser beam may be provided substantially at a growth location of a graphene crystal. Early in processing the laser beam may provide heating to the feedstock and/or the seed crystal, or portions thereof. Later in processing, the laser beam may provide heating to the feedstock and/or the growing graphene crystal, or portions thereof. In some examples, a single laser and associated beam shaping optics may be used. In other examples, two or three or more combinations of lasers and associated beam shaping optics may be used.

In general, the beam shaping optics may be configured to couple the laser beam to the material that is to be heated (i.e., feedstock, seed crystal, or growing graphene crystal). In some examples, the beam shaping optics may include a reflaxicon, which may include an inner cone surrounded by a larger coaxial cone section with both cones having reflecting surfaces. A reflaxicon may configured to provide a circularly symmetric laser beam irradiance that may be utilized for a circularly symmetric temperature distribution. In some examples, the optical characteristics of the reflaxicon may be used to control the radial temperature distribution of, for example, the seed crystal, the graphene crystal or the feedstock, and may control the growth rate of the graphene crystal.

In some examples, the beam shaping optics may include a beam profiling projector. A beam profiling projector may have a similar arrangement to a reflaxicon but in a linear orientation. In some examples, the beam profiling projector may include an inner mirror substantially in the shape of a wedge and an outer mirror having a larger and associated wedge shape. In some examples, the beam profiling projector may be configured to produce a substantially linear or rectangular beam irradiance that may be substantially symmetric about the long axis of the incident pattern of the beam. In some examples, the beam profiling projector may be used to control the axial temperature distribution at the seed crystal and the graphene crystal growth rate. In various examples, the beam shaping optics may be operated under the control of a process control unit, as is discussed further herein.

The laser or lasers and associated beam shaping optics may be arranged in a wide variety of suitable manners. In some examples, multiple lasers may be arranged on opposing sides of seed crystal 115 and about location 190. In some examples, the beam shaping optics may be incorporated with the laser such that they may be in the housing and considered as a unit. In some examples, beam shaping optics may not be used. In some examples, a single laser may be used and the laser beam irradiated from the laser may be split and sent to multiple beam shaping optics for delivery about location 190.

As discussed, the laser beams or beams may be provided using a laser or lasers. In general, the laser or lasers may be a wide variety of laser or lasers suitable for providing the laser beam. In various examples, the laser or lasers may be one of or various combinations of a $CO_2$ laser, a Nd:YAG laser, or a laser diode. In some examples, the laser or lasers may provide continuous wave irradiation. In other examples, the laser or lasers may provide pulsed irradiation. A wide variety of suitable wavelengths of irradiation may be used. In various examples, LongWave InfraRed (LWIR) irradiation (about 10,000 nm), low energy UltraViolet (UV) irradiation (about 337 nm), short pulse UV irradiation (about 193 nm), or various combinations thereof, may be used. The laser beam may be provided at various suitable intensities. In some examples, the intensity may remain substantially stable or consistent, which may be facilitated by a stable power output for laser. In some examples, the beam intensity may be varied during exposure.

Figure 3:
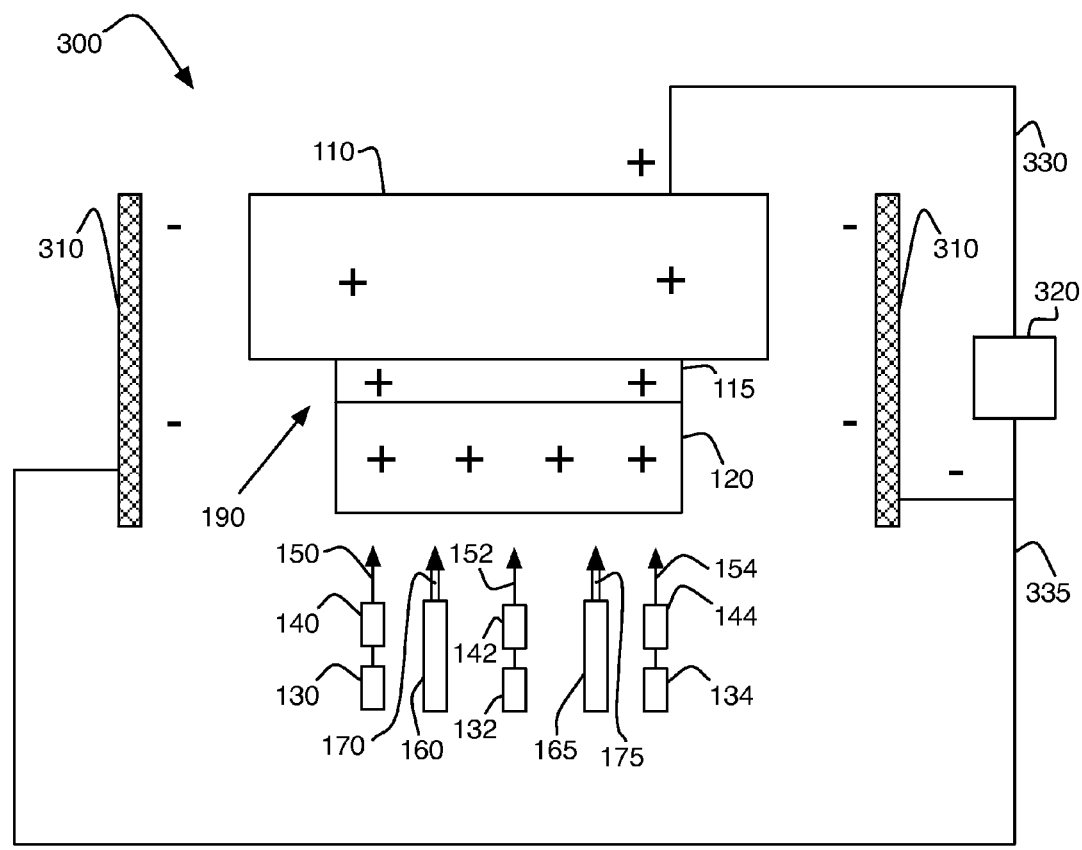
FIG. 3 is an illustration of an example apparatus for producing graphene.

FIG. 3 is an illustration of an example apparatus 300 that may be configured to produce graphene crystal 120, arranged in accordance with at least some embodiments described herein. Apparatus 300 may include a support substrate 110, lasers 130, 132, 134, beam shaping optics 140, 142, 144, feedstock injectors 160, 165, an electrostatic enclosure 310, a power source 320, and electrodes 333, 335. As discussed with reference to FIG. 1, a seed crystal 115 may be affixed to support substrate about a location 190 and graphene crystal 120 may be formed using any of the methods or techniques described herein.

As shown in FIG. 3, apparatus 300 may include electrostatic enclosure 310, power source 320, and electrodes 333, 335, which may be configured to provide an electrostatic field that may be effective to provide a straightening force to graphene crystal 120. As shown, in some examples, a net positive charge may be applied to support substrate 110, seed crystal 115 and graphene crystal 120 using electrode 330 and a net negative charge may be applied to electrostatic enclosure 310 using electrode 335. In other examples, a net negative charge may be applied to support substrate 110, seed crystal 115 and graphene crystal 120 using electrode 330 and a net positive charge may be applied to electrostatic enclosure 310 using electrode 335. The electrostatic charges may provide an electrostatic repulsion that may provide a straightening force to graphene crystal 120. The straightening force may prevent the crystal from raveling and may be considered an anti-raveling force. By maintaining the crystal substantially straight, graphene quality and processing yields may be improved.

In some examples, the support pedestal, the seed crystal and the graphene crystal may be entirely or substantially surrounded by electrostatic enclosure 310. In other examples, the enclosure may include segments of enclosure that may substantially surround the support pedestal, the seed crystal and the graphene crystal. In various examples, two, three or four or more segments may be used.

Figure 4:
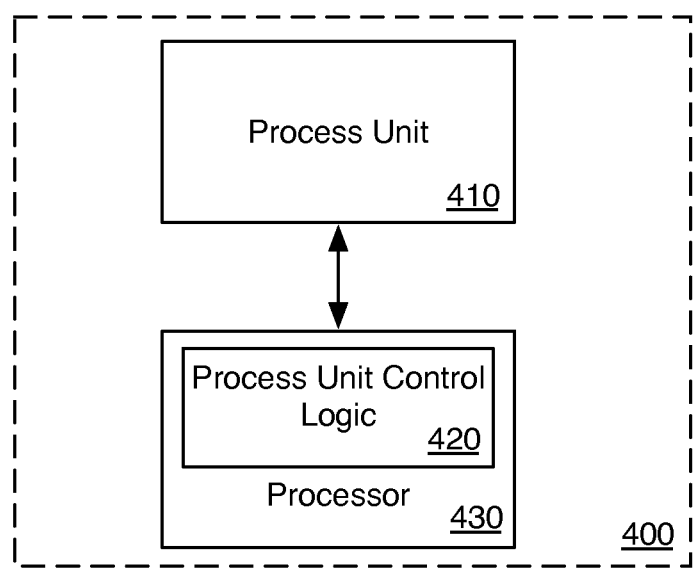
FIG. 4 is an illustration of an example system for producing graphene.

Turning now to other embodiments that may perform any of the methods as described herein, FIG. 4 illustrates an example system 400 for producing graphene in accordance with at least some embodiments of the present disclosure. System 400 may be used to perform some or all of the functions described herein in connection with FIGS. 1 to 3. System 400 may include a process unit 410 operably coupled to a processor 430 that may include process unit control logic 420. Process unit 410 may include any or all of the process unit characteristics as described herein. In some examples, process unit 410 may include a support substrate, one or more lasers and one or more feedstock injectors. In other examples, process unit 410 may also include an electrostatic enclosure, a power supply, and associated electrodes. In an example, the components of the process unit may be housed in a chamber. The process unit may also include electro-mechanical devices that may be configured to actuate the various components. In some examples, the lasers, the feedstock injectors, or a crystal removal device may be automatically or robotically actuated.

In some examples, system 400 may include a processor 430. In some examples, processor 430 may be implemented as part of a computer system. System 400 may include process unit control logic 420 that may be configured to undertake various methods, functional operations, actions, or blocks such as those described previously for FIGS. 1 to 3. Further, system 400 may include additional items such as memory, a router, network interface logic, etc. Process unit control logic 420 may be configured to provide any of the functionality described herein and claimed subject matter is not limited to specific types or manifestations of processing logic. For example, processor 430 may be a microprocessor or Central Processing Unit (CPU). In other implementations, processor 430 may be an Application Specific Integrated Circuit (ASIC), a Field Programmable Gate Array (FPGA), a digital signal processor (DSP), or other integrated formats. Processor 430 and process unit 410 may communicate by various suitable means, such as, for example, by wired connections or wireless connections.

FIG. 5 illustrates an example computer program product 500 arranged in accordance with at least some embodiments of the present disclosure. Computer program product 500 may include a signal bearing medium 502. Signal bearing medium 502 may include one or more machine-readable instructions 504, which, when executed by one or more processors, may operatively enable a computing device to provide the functionality described herein with respect to FIGS. 1 to 4. Thus, for example, referring to the system of FIG. 4, processor 430 may undertake one or more of the actions shown in FIGS. 1 to 3 in response to instructions 504 conveyed by medium 502.

In some implementations, signal bearing medium 502 may encompass a computer-readable medium 506, such as, but not limited to, a hard disk drive, a Compact Disc (CD), a Digital Video Disk (DVD), a digital tape, memory, etc. In some implementations, signal bearing medium 502 may encompass a recordable medium 508, such as, but not limited to, memory, read/write (R/W) CDs, R/W DVDs, etc. In some implementations, signal bearing medium 502 may encompass a communications medium 510, such as, but not limited to, a digital and/or an analog communication medium (e.g., a fiber optic cable, a waveguide, a wired communication link, a wireless communication link, etc.).

Figure 6:
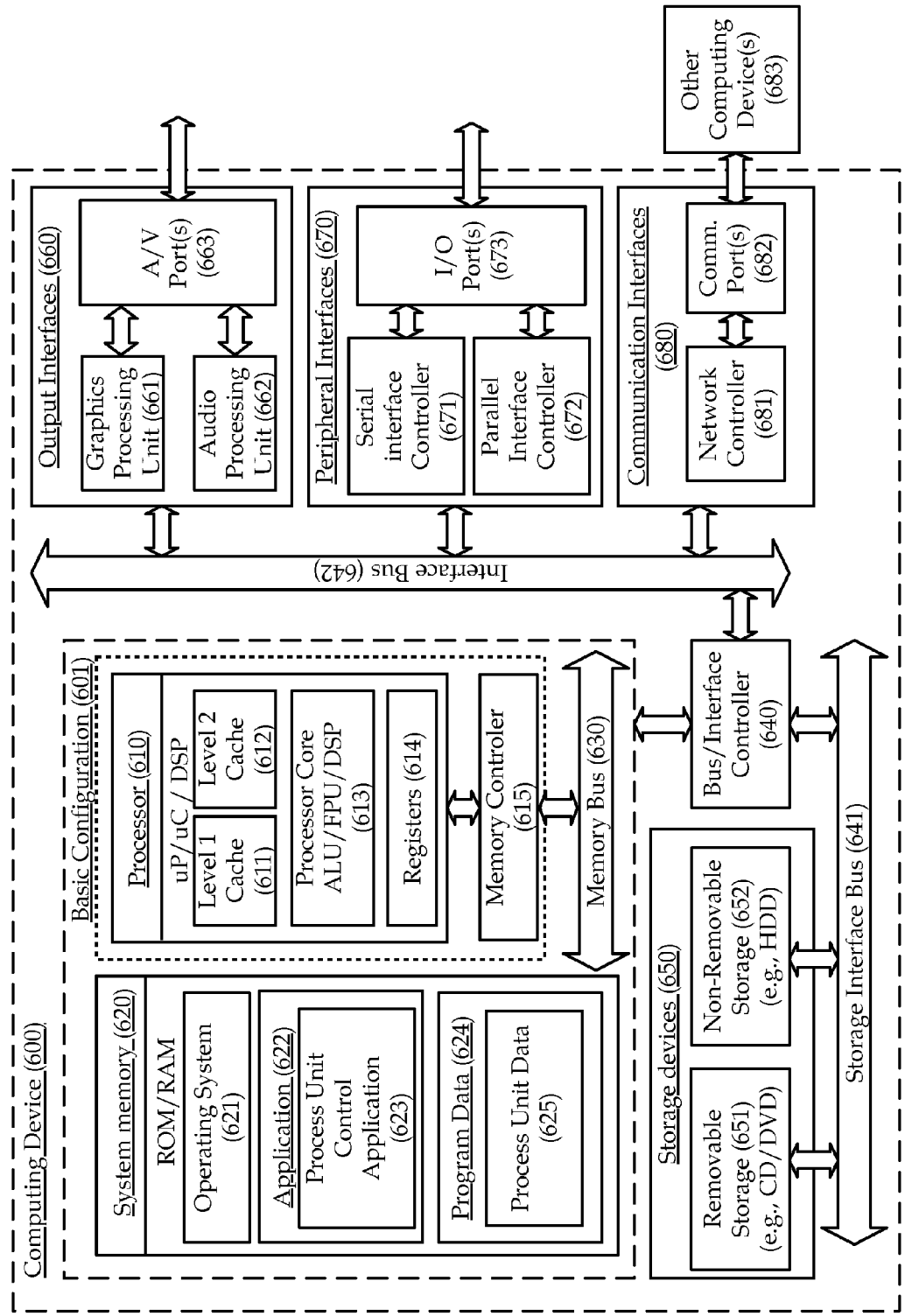
FIG. 6 is a block diagram illustrating an example computing device, all arranged in accordance with at least some embodiments of the present disclosure.

FIG. 6 is a block diagram illustrating an example computing device 600 that is arranged in accordance with at least some embodiments of the present disclosure. In some examples, basic configuration 601, computing device 600 may include one or more processors 610 and system memory 620. A memory bus 630 can be used for communicating between the processor 610 and the system memory 620.

Depending at least in part on the configuration, processor 610 may be of a wide variety of types including but not limited to a microprocessor (µP), a microcontroller (µC), a digital signal processor (DSP), or any combination thereof. Processor 610 can include one or more levels of caching, such as a level one cache 611 and a level two cache 612, a processor core 613, and registers 614. The processor core 613 can include an arithmetic logic unit (ALU), a floating point unit (FPU), a digital signal processing core (DSP Core), or any combination thereof. A memory controller 615 can also be used with the processor 610, or in some implementations the memory controller 615 can be an internal part of the processor 610.

Depending at least in part on the configuration, the system memory 620 may be of any type including but not limited to volatile memory (such as RAM), non-volatile memory (such as ROM, flash memory, etc.) or any combination thereof. System memory 620 may include an operating system 621, one or more applications 622, and program data 624. Application 622 may include process unit control application 623 that can be arranged to perform the functions, actions, and/or operations as described herein including the functional blocks, actions, and/or operations described with respect to FIGS. 1 to 4. Program Data 624 may include process unit data 625 for use with the flash memory algorithm 623. In some example embodiments, application 622 may be arranged to operate with program data 624 on an operating system 621. This described basic configuration is illustrated in FIG. 6 by those components within dashed line 601.

Computing device 600 may have additional features or functionality, and additional interfaces to facilitate communications between the basic configuration 601 and any required devices and interfaces. For example, a bus/interface controller 640 may be used to facilitate communications between the basic configuration 601 and one or more data storage devices 650 via a storage interface bus 641. The data storage devices 650 may be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 620, removable storage 651 and non-removable storage 652 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the information and which may be accessed by computing device 600. Any such computer storage media may be part of device 600.

Computing device 600 may also include an interface bus 642 for facilitating communication from various interface devices (e.g., output interfaces, peripheral interfaces, and communication interfaces) to the basic configuration 601 via the bus/interface controller 640. Example output interfaces 660 may include a graphics processing unit 661 and an audio processing unit 662, which may be configured to communicate to various external devices such as a display or speakers via one or more A/V ports 663. Example peripheral interfaces 670 may include a serial interface controller 671 or a parallel interface controller 672, which may be configured to communicate with external devices such as input devices (e.g., keyboard, mouse, pen, voice input device, touch input device, etc.) or other peripheral devices (e.g., printer, scanner, etc.) via one or more I/O ports 673. An example communication interface 680 includes a network controller 681, which may be arranged to facilitate communications with one or more other computing devices 683 over a network communication via one or more communication ports 682. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 600 may also be implemented as a personal computer including both laptop computer and non-laptop computer configurations. In addition, computing device 600 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Video Disk (DVD), a digital tape, a computer memory, etc.; and a transmission type medium such as a digital and/or an analog communication medium (e.g., a fiber optic cable, a waveguide, a wired communication link, a wireless communication link, etc.).

The herein described subject matter sometimes illustrates different components contained within, or connected with, different other components. It is to be understood that such depicted architectures are merely examples and that in fact many other architectures can be implemented which achieve the same functionality. In a conceptual sense, any arrangement of components to achieve the same functionality is effectively "associated" such that the functionality is achieved. Hence, any two components herein combined to achieve a particular functionality can be seen as "associated with" each other such that the functionality is achieved, irrespective of architectures or intermedial components. Likewise, any two components so associated can also be viewed as being "operably connected", or "operably coupled", to each other to achieve the functionality, and any two components capable of being so associated can also be viewed as being "operably couplable", to each other to achieve the functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While certain example techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method for producing graphene comprising:
   affixing a seed crystal to a support substrate such that the seed crystal faces downwardly from the support substrate about a location;
   providing a feedstock adjacent to the seed crystal about the location; and
   applying a laser beam to heat at least a portion of the seed crystal and at least a portion of the feedstock about the location, wherein a graphene crystal is formed that hangs downwardly from a surface of the support structure.

2. The method of claim 1, further comprising:
   applying an electrostatic field to the graphene crystal, wherein the electrostatic field is effective to apply a straightening force to the downwardly hanging graphene crystal.

3. The method of claim 1, wherein affixing the seed crystal to the support substrate comprises securing the seed crystal to the support substrate with an epoxy.

4. The method of claim 1, wherein affixing the seed crystal to the support substrate comprises aligning a crystal growth axis of the seed crystal such that the feedstock and the laser beam are provided incident to the crystal growth axis.

5. The method of claim 1, wherein the feedstock comprises at least one of carbon, graphite particles, an oxidizer or a reducer.

6. The method of claim 1, wherein applying the laser beam comprises passing the laser beam through beam shaping optics.

7. The method of claim 6, wherein the beam shaping optics comprise a reflaxicon.

8. A method for producing graphene comprising:
   affixing a seed crystal to a support substrate such that the seed crystal faces downwardly from the support substrate about a starting location;
   providing, by a feedstock injector, a feedstock adjacent to the seed crystal about the starting location;
   applying, by a laser, a laser beam to heat at least a portion of the seed crystal and at least a portion of the feedstock about the starting location, wherein a graphene crystal is formed that hangs downwardly from a surface of the support structure; and
   moving the feedstock injector and the support substrate relative to each other to continuously provide the feedstock at a position of growth of the graphene crystal.

9. The method of claim 8, wherein moving the feedstock injector and the support substrate relative to each other comprises moving the support substrate while the feedstock injector remains stationary.

10. The method of claim 8, further comprising:
    preheating the seed crystal.

11. The method of claim 8, wherein the support substrate comprises at least one of silicon carbide, silicon dioxide, or copper.

12. The method of claim 8, wherein the laser comprises at least one of a $CO_2$ laser, a Nd:YAG laser or a laser diode.

13. The method of claim 8, wherein applying the laser beam comprises passing the laser beam through beam shaping optics that are cooperatively configured to provide multiple laser beams in a linear two dimensional array.

14. The method of claim 8, wherein a composition of the feedstock changes during processing.

15. A method for producing graphene comprising:
affixing a seed crystal to a support substrate such that the seed crystal faces downwardly from the support substrate about a location;
providing a feedstock adjacent to the seed crystal about the location; and
applying a laser beam from a beam profiling projector to heat at least a portion of the seed crystal and at least a portion of the feedstock about the location, wherein a graphene crystal is formed that hangs downwardly from a surface of the support structure.

16. The method of claim 15, wherein the laser beam comprises at least one of a linear shape or a rectangular shape.

17. The method of claim 15, wherein the beam profiling projector comprises an inner mirror shaped as a wedge and an outer mirror having a larger and associated wedge shape.

18. The method of claim 15, further comprising:
removing the graphene crystal from the support substrate.

19. The method of claim 18, wherein removing the graphene crystal from the support substrate comprises at least one of cutting, laser cutting, removal by force, heating, or dissolving an epoxy used to affix the seed crystal to the support substrate.

20. The method of claim 18, wherein providing the feedstock comprises providing the feedstock in a laminar flow regime.

* * * * *

UNITED STATES PATENT AND TRADEMARK OFFICE
CERTIFICATE OF CORRECTION

PATENT NO. : 8,512,669 B2  
APPLICATION NO. : 13/129557  
DATED : August 20, 2013  
INVENTOR(S) : Hauck Page 1 of 1

It is certified that error appears in the above-identified patent and that said Letters Patent is hereby corrected as shown below:

In the Drawings

In Fig. 6, Sheet 6 of 6, delete "uP/uC/DSP" and insert -- µP/µC/DSP --, therefor.

In Fig. 6, Sheet 6 of 6, in Box "(615)", in Line 1, delete "Controler" and insert -- Controller --, therefor.

Signed and Sealed this  
Second Day of June, 2015

Michelle K. Lee  
*Director of the United States Patent and Trademark Office*